(12) United States Patent
Pineau et al.

(10) Patent No.: US 11,422,180 B2
(45) Date of Patent: Aug. 23, 2022

(54) PARTIAL DISCHARGE DETECTOR AND ASSOCIATED METHOD

(71) Applicant: HYDRO-QUÉBEC, Varennes (CA)

(72) Inventors: Daniel Pineau, Saint-Bruno (CA); Martin Charette, Montréal (CA); Lionel Reynaud, Longueuil (CA)

(73) Assignee: HYDRO-QUÉBEC

( * ) Notice: Subject to any disclaimer, the term of this patent is extended or adjusted under 35 U.S.C. 154(b) by 0 days.

(21) Appl. No.: 17/310,591

(22) PCT Filed: Feb. 14, 2020

(86) PCT No.: PCT/CA2020/050194
§ 371 (c)(1),
(2) Date: Aug. 12, 2021

(87) PCT Pub. No.: WO2020/163961
PCT Pub. Date: Aug. 20, 2020

(65) Prior Publication Data
US 2022/0107352 A1 Apr. 7, 2022

(30) Foreign Application Priority Data
Feb. 14, 2019 (CA) ..................................... 3033769

(51) Int. Cl.
*G01R 31/08* (2020.01)
(52) U.S. Cl.
CPC .................................. *G01R 31/088* (2013.01)
(58) Field of Classification Search
CPC ........................... G01R 31/088; G01R 31/1272
(Continued)

(56) References Cited

U.S. PATENT DOCUMENTS

| 4,547,769 A | 10/1985 | Tanigaki et al. |
| 4,814,699 A | 3/1989 | Koziel et al. |

(Continued)

FOREIGN PATENT DOCUMENTS

| CA | 2273526 A1 | 4/2000 |
| CA | 2208994 C | 10/2001 |

(Continued)

OTHER PUBLICATIONS

Written Opinion for PCT/CA2020/050194 dated May 13, 2020.

*Primary Examiner* — Farhana A Hoque
(74) *Attorney, Agent, or Firm* — Thompson Coburn LLP

(57) ABSTRACT

An apparatus and method for detecting a partial discharge produced at a discharge site in electrical equipment or accessories are provided. The apparatus includes two sensors having an operating range below 30 Megahertz, between 5 and 30 Megahertz, between 14 and 20 Megahertz, or centered at 18 Megahertz. The apparatus includes an acquisition module, a processor and an alarm module producing an alarm upon detection of a partial discharge in the electrical equipment or accessories. The method includes detecting magnetic fields with the sensors, generating and receiving two signals and producing a resulting signal by processing the two signals. The processor is configured to issue alarm instructions if the resulting signal exhibits a property representative of a detection of the partial discharge and otherwise remain in a standby state (ready for signal detection). The method includes generating an alarm after issuing the alarm instructions.

24 Claims, 13 Drawing Sheets

(58) Field of Classification Search
USPC .......................................................... 324/536
See application file for complete search history.

(56) References Cited

U.S. PATENT DOCUMENTS

| | | | |
|---|---|---|---|
| 5,075,629 | A | 12/1991 | Umemura et al. |
| 5,804,972 | A | 9/1998 | de Kock et al. |
| 6,297,642 | B1 | 10/2001 | Shibahara et al. |
| 6,333,715 | B1 | 12/2001 | Kato et al. |
| 7,112,968 | B1 | 9/2006 | Nishizawa |
| 7,256,584 | B2 | 8/2007 | Moriyama et al. |
| 7,577,535 | B2 | 8/2009 | Anderson et al. |
| 7,746,082 | B2 | 6/2010 | Maruyama et al. |
| 7,782,063 | B2 | 8/2010 | Ohtsuka et al. |
| 7,912,660 | B2 | 3/2011 | Anderson et al. |
| 9,612,271 | B2 * | 4/2017 | Cern .................... G01R 31/083 |

FOREIGN PATENT DOCUMENTS

| | | |
|---|---|---|
| CA | 2013552 C | 7/2003 |
| CA | 2508428 A1 | 11/2006 |
| CA | 2608216 A1 | 11/2006 |
| CA | 2727339 A1 | 12/2009 |
| CN | 206378539 U | 8/2017 |
| WO | 2013185820 A1 | 12/2013 |

\* cited by examiner

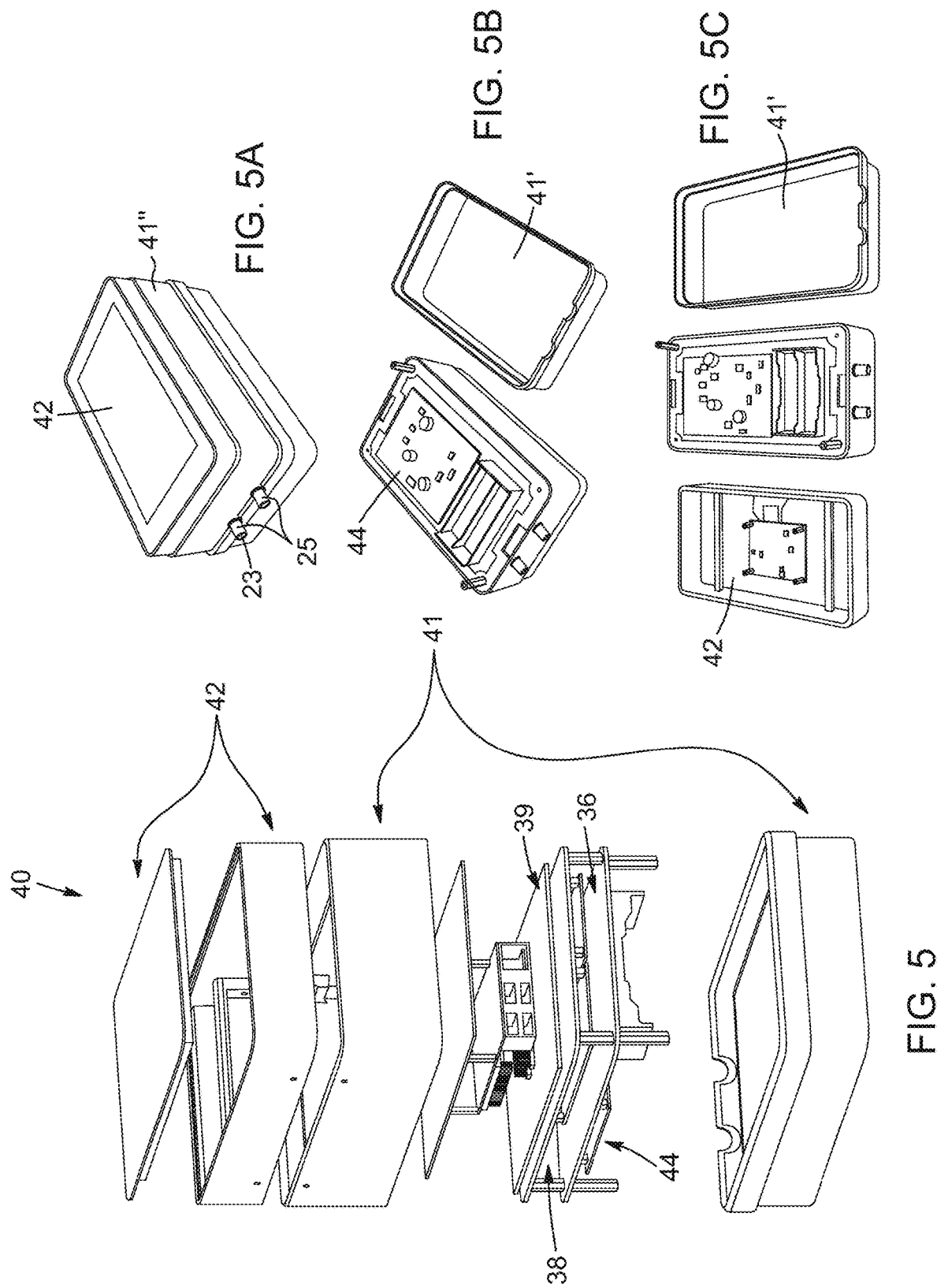

PARTIAL DISCHARGE DETECTOR AND ASSOCIATED METHOD

CROSS-REFERENCE TO RELATED APPLICATIONS

This application is a U.S. National Phase application of PCT/CA2020/050194, filed on Feb. 14, 2020, which claims the benefit of Canadian Application No. 3,033,769, filed Feb. 14, 2019, both of which are incorporated herein by reference in their entirety.

TECHNICAL FIELD

The present application relates to apparatuses and methods for detecting, locating and interpreting one or more partial discharges occurring at a discharge site in electrical equipment or accessories, the electrical equipment or accessories being part of an electrical grid.

BACKGROUND

At least some of the electrical failures occurring in a power grid are due to partial discharges occurring in electrical equipment or accessories. Partial discharges may be due to a problem in the materials used in the manufacture of such electrical equipment or accessories, to the degradation of the electrical insulation in such electrical equipment or accessories, or to an error in the assembly of such electrical equipment or accessories. In addition to electrical failures, the presence of partial discharges in electrical equipment or accessories can also be associated with safety issues for workers performing maintenance or repairs on the power grid.

At least some of the existing devices and methods are not efficient or have suboptimal performances, are limited to a certain type of equipment and/or do not allow to locate partial discharges in a sufficiently precise way.

Some of the existing solutions identify, locate and/or interpret partial discharges incorrectly or sub-optimally, resulting, in some cases, in the detection of false positives and/or false negatives.

In light of the above, there is therefore a need for a device and a method that address at least one of the problems and/or limitations discussed above.

SUMMARY

In accordance with one aspect, there is provided an apparatus for detecting a partial discharge occurring at a discharge site in an electrical equipment or accessory, the partial discharge producing a current wave, the current wave being associated with a first magnetic field located on a first side of the discharge site and a second magnetic field located on a second side of the discharge site, the second side being opposite the first side, the apparatus including:
- a first sensor and a second sensor, each sensor having an operating range below 30 Megahertz, the first sensor being configured to detect the first magnetic field and produce a first signal representative of the first magnetic field, and the second sensor configured to detect the second magnetic field and produce a second signal representative of the second magnetic field;
- an acquisition module operatively connected to the first sensor and the second sensor, the acquisition module being configured to receive and record the first signal and the second signal;
- a processor operatively connected to the acquisition module, the processor being configured to process the first signal and the second signal to obtain a resulting signal for:
  - issuing alarm instructions if the resulting signal has a property representative of a partial discharge; and
  - remaining in a standby mode otherwise; and
- an alarm module operatively connected to the processor, the alarm module being configured to receive the alarm instructions from the processor and produce an alarm upon reception thereof.

In some embodiments, the operating range of the first sensor and the second sensor is between 5 and 30 Megahertz, preferably between 14 and 20 Megahertz and even more preferably centered around 18 Megahertz.

In some embodiments, the acquisition module is configured to convert the first signal and the second signal from an analog domain to a digital domain, to produce a first digital signal and a second digital signal.

In some embodiments, the acquisition module includes a first circular data buffer and a second circular data buffer,
- the first circular data buffer being configured to continuously acquire the first digital signal; and
- the second circular data buffer being configured to continuously acquire the second digital signal.

In some embodiments, the apparatus further includes an amplification circuit operatively connected to the first sensor, the second sensor, and the acquisition module.

In some embodiments, the amplification circuit is located upstream of the acquisition module and includes two channels, each being operatively connected to a corresponding sensor,
- a first one of the two channels being configured to receive and amplify the first signal; and
- a second one of the two channels being configured to receive and amplify the second signal.

In some embodiments, each of the two channels includes an analog-to-digital converter having a sampling rate of 200 mega samples per second.

In some embodiments, the apparatus further includes a trigger circuit operatively connected to the acquisition module, the trigger circuit being configured to:
- detect one of the first signal and the second signal after amplification thereof;
- generate a trigger signal if a threshold value is reached and otherwise remain in a standby mode; and
- send the trigger signal to the acquisition module.

In some embodiments, upon receiving the trigger signal:
the acquisition module determines that the first circular data buffer and the second circular data buffer each contain data;
the first circular data buffer:
  stores first data representative of the first digital signal, the first data including pre-trigger data and post-trigger data; and
  sends the first data to the processor for processing;
the second circular data buffer:
  stores second data representative of the second digital signal, the second data including pre-trigger data and post-trigger data; and
  sends the second data to the processor for processing; and
the processor sends restart instructions to the acquisition module to restart storing the data in the first circular data buffer and the second circular data buffer.

In some embodiments, the threshold value is a voltage value (in V).

In some embodiments, the voltage value is between 1 mV and 100 mV.

In some embodiments, the threshold value is a current value (in A).

In some embodiments, the threshold value is adjustable.

In some embodiments, the resulting signal is obtained by performing algorithmic processing of the first data and the second data.

In some embodiments, the algorithmic processing includes performing a product of the first data and the second data.

In some embodiments, the algorithmic processing is performed continuously and in real time.

In some embodiments, the apparatus further includes a housing for receiving the acquisition module, the processor, and the alarm module.

In some embodiments, the apparatus is portable.

In some embodiments, the alarm module is configured to receive the alarm instructions from the processor and produce the alarm in real time.

In some embodiments, the apparatus further includes a display module configured to display the resulting signal in real time.

In some embodiments, the apparatus further includes a power module.

In some embodiments, the alarm module includes a visible alarm.

In some embodiments, the alarm module includes an audible alarm.

In accordance with another aspect, there is provided a method for detecting a partial discharge occurring at a discharge site in an electrical equipment or accessory, the partial discharge producing a current wave, the current wave being associated with a first magnetic field located on a first side of the discharge site and a second magnetic field located on a second side of the discharge site, the second side being opposite the first side, the method including:
  detecting the first magnetic field and the second magnetic field with a first sensor and a second sensor, each sensor having an operating range below 30 Megahertz;
  generating a first signal representative of the first magnetic field and a second signal representative of the second magnetic field
  acquiring the first signal and the second signal;
  producing a resulting signal by processing the first signal and the second signal with a processor, the processor being configured to:
    issue alarm instructions if the resulting signal has a property representative of a detection of the partial discharge; and
    remain in a standby mode otherwise; and
    produce an alarm following issuance of the alarm instructions.

In some embodiments, the operating range is between 5 and 30 Megahertz, preferably between 14 and 20 Megahertz and even more preferably centered around 18 Megahertz.

In some embodiments, the method further includes:
  converting the first signal and the second signal from an analog domain to a digital domain; and
  generating a first digital signal and a second digital signal.

In some embodiments, the method includes:
  acquiring the first digital signal with a first circular data buffer; and
  acquiring the second digital signal with a second circular data buffer.

In some embodiments, said acquiring the first digital signal and said acquiring the second digital signal is performed continuously.

In some embodiments, the method further includes amplifying the first signal and the second signal.

In some embodiments, said converting the first signal and the second signal from the analog domain to the digital domain is performed at a sampling rate of 200 mega samples per second.

In some embodiments, the method further includes:
  detecting one of the first signal and the second signal after amplification thereof;
  generating a trigger signal if a threshold value is reached and remaining in a standby mode otherwise; and
  sending the trigger signal to the acquisition module.

In some embodiments, the method further includes, upon receiving the trigger signal:
  determining that the first circular data buffer and the second circular data buffer each contain pre-trigger data and post-trigger data;
  storing first data representative of the first digital signal with the first circular data buffer
  storing second data representative of the second digital signal with the second circular data buffer; and
  sending the first data and the second data to the processor for processing; and
  sending restart instructions to the acquisition module to restart recording of the data in the first circular data buffer and the second circular data buffer.

In some embodiments, the threshold value is a voltage value (in V).

In some embodiments, the voltage value is between 1 mV and 100 mV.

In some embodiments, the threshold value is a current value (in A).

In some embodiments, the method further includes adjusting the threshold value.

In some embodiments, the method further includes performing algorithmic processing on the first data and the second data.

In some embodiments, the method further includes performing a product of the first data and the second data.

In some embodiments, the algorithmic processing is performed continuously and in real time.

In some embodiments, receiving the alarm instructions from the processor and generating the alarm are performed in real time.

In some embodiments, the method further includes displaying the resulting signal in real time.

In some embodiments, the method further includes emitting a visual alarm.

In some embodiments, the method further includes emitting an audible alarm.

The technology and its advantages will be more apparent from the following non-limiting description of preferred embodiments of the technology, made with reference to the attached drawings.

BRIEF DESCRIPTION OF THE DRAWINGS

FIGS. 5 and 5A-5C show an embodiment of a housing included in the apparatus.

DETAILED DESCRIPTION

Figure 1:
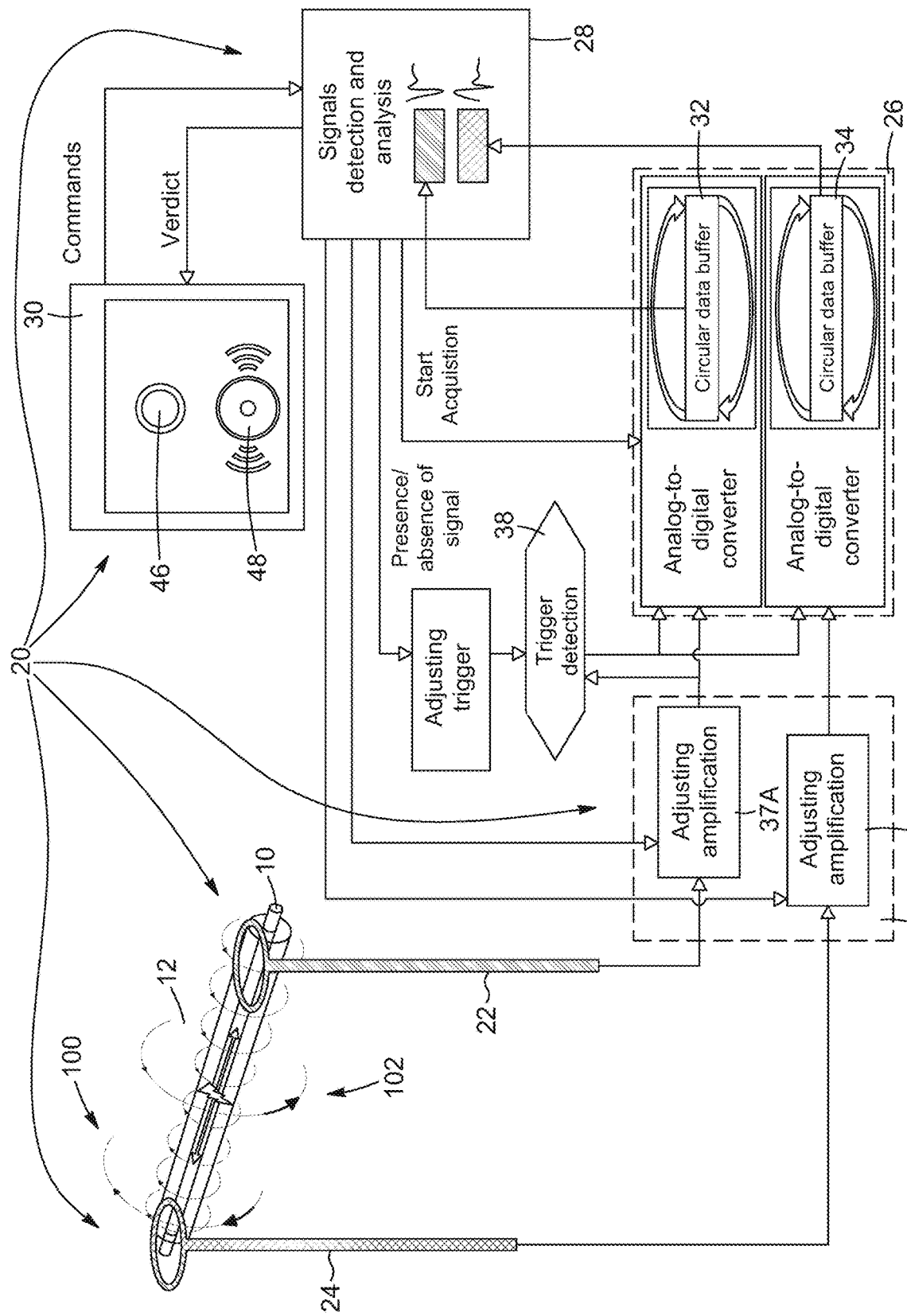
FIG. 1 is a schematic diagram of an apparatus for detecting a partial discharge, according to an embodiment.

In the following description, similar components and/or features in the figures are represented by the same reference numbers. In order not to clutter the figures, some elements are not identified on all figures if they have already been shown on previous figures. The elements shown in the figures are not necessarily to scale and the emphasis is rather on clearly illustrating the elements and structures of the various embodiments shown below.

Although the embodiments described and illustrated include various components, and although some of these components have certain geometric configurations, it is understood that the number of components and their geometries may vary, and thus should not be taken in their restrictive sense and should not be construed to limit the scope of the present technology. It should be understood, as will also be apparent to the person skilled in the art, that other suitable components, as well as other suitable geometric configurations, may be used for the present technology and corresponding parts of the present technology.

All technical and scientific terms and phrases used in this description have the same definitions as those generally understood by the person skilled in the art of current technology. Definitions of certain terms and phrases used are, however, provided below.

The expression "about" as used herein means "approximately," "in the region of," "around," or any other term having a similar meaning. For example, when the term "about" is used in connection with a numerical value, it could modify it above and/or below by a predetermined variation. In some examples, the predetermined variation is about 10% from the nominal value. This term may also account for, for example, experimental error(s) of a measuring device, rounding and/or statistical deviations. When a range of values is mentioned in this present application, the lower and upper bounds of the range are, unless otherwise specified, always included in the definition.

The expression "partial discharge" refers to a localized electrical discharge in a dielectric material exposed to an electric field. The partial discharge at least partially short-circuits a region between conductors for a relatively short time. A partial discharge occurs at a "discharge site", i.e., a region of the cable or accessory with a manufacturing defect, an assembly defect or material defect, located in a portion of the volume of the dielectric material, generally when it is exposed to the electric field.

The expression "signal" represents a variation of a physical quantity. A signal can be analog or digital, and typically carries information. A signal can be continuous or discrete and can have different characteristics such as, for example and without being limitative, a period, an amplitude, and a phase. For example, in the context of electrical applications, an electrical signal may be representative of a potential difference, an intensity of an electrical current, a variation of an amplitude, a variation of a frequency, a variation of a phase and/or any other relevant physical quantities. It should be noted that the properties of a signal can be measured. During a measurement, a sample comprising a data set is obtained. The data set is generally representative of the measured signal. The "measurement time" represents the duration, usually finite, of the acquisition of a sample comprising a data set. Following its acquisition, the signal (or the sample comprising a data set representative of the signal) can be processed. The "processing" of a signal typically includes a method, a process and/or the use of technique(s) to confirm the presence (or absence) of partial discharges, to locate the discharge site if applicable, and/or to reveal certain physical characteristics relevant to the characterization of partial discharges. For example, and without being limitative, signal processing may include operations or a sequence of mathematical operations. These operations may include, but are not limited to: control, filtering, compression, transmission, noise reduction, convolution, deconvolution, prediction, identification and/or classification, in addition to other basic mathematical operations (e.g., addition, subtraction, multiplication and/or division). Thus, signal processing typically provides a property of a signal that can be subsequently associated with a physical quantity or variation thereof, which in turn can be associated with the presence or absence of a partial discharge in the electrical equipment or accessory being measured.

It should be noted that while the expression "electrical equipment" generally but not exclusively refers to relatively large equipment such as a transformer, switch, circuit breaker, disconnect switch or other similar component, and that the expression "electrical accessory" generally but not exclusively refers to a smaller accessory that may or may not be located on electrical equipment such as a bent plug, a junction, a fuse, a cover or other similar component(s). It is understood that the passages of the description applying to electrical equipment could equally well apply to an electrical accessory, and vice versa. Thus, for the sake of clarity and brevity, portions of the description or examples included therein may refer to either electrical equipment or electrical accessory, although they could apply to both.

The expressions "external radiation," "external disturbance," or any other similar expressions represent electrical, magnetic, or electromagnetic noise. Noise is understood here as a signal having a different origin than the signal associated with a partial discharge. For example, a signal associated with noise generally has different properties than a partial discharge signal.

The apparatus(es), system(s), and method(s) described herein may be implemented in computer programs running on programmable computers (e.g., a microcontroller), each comprising at least one processor, a data storage system comprising, for example and without being limitative, volatile and non-volatile memory elements, at least one input device, and at least one output device. In some examples, the programmable computer may be a programmable logic unit, a mainframe computer, a server and personal computer, a cloud computing system, a laptop computer, a personal data assistant, a cell phone, a smartphone, a wearable device, a tablet, a smart display device, a set-top box, or a virtual reality device. Each program is preferably implemented in a high-level programming language, procedural programming language or object-oriented programming language for communicating with a computer system. However, the programs may be implemented in assembly language or machine language. In either case, the language may be a compiled or an interpreted language. Each of these computer programs is preferably stored on a storage medium or device readable by a general or special programmable computer for configuration and operation of the computer when the storage medium or device is read by the computer to perform the procedures described in this description. In some embodiments, the systems may be integrated with an operating system running on the programmable computer.

In accordance with embodiments, the present description relates to an apparatus and a method for detecting a partial discharge in an electrical equipment or accessory. The electrical equipment or accessory may be part of a power grid and, in some embodiments, an electrical distribution network. Embodiments of the apparatus that will be described are also compatible with accessories and equipment used in an underground electrical network.

Apparatus for Detecting a Partial Discharge

Figure 2:
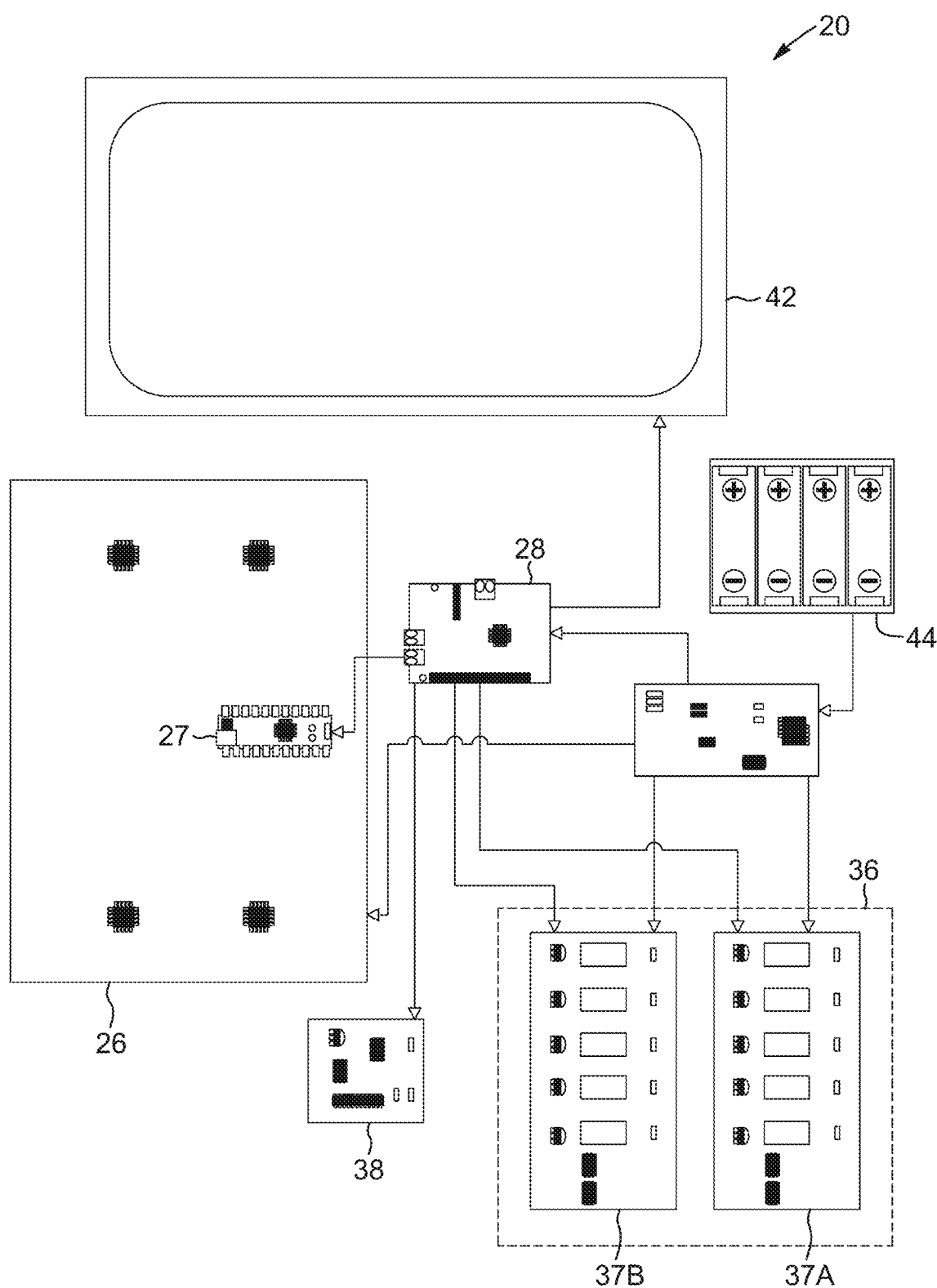
FIG. 2 illustrates various elements included the apparatus for detecting a partial discharge.

An apparatus 20 for detecting one or more partial discharges occurring at a discharge site in electrical equipment is illustrated in FIGS. 1 and 2.

When a partial discharge occurs in an electrical equipment or accessory 10, the partial discharge generates a current wave. The current wave is associated with two magnetic fields 100, 102. This association includes, but is not limited to, the generation of the two magnetic fields 100, 102. For example, a first magnetic field 100 is generated and located on a first side of the discharge site, while a second magnetic field 102 is generated and located on a second side of the discharge site. The second side is generally opposite the first side, such that the first magnetic field 100 and the second magnetic field 102 are not included in the same space, but rather in two adjacent locations that may be contiguous, i.e., the two magnetic fields may share a common boundary, such as in proximity to the partial discharge. For example, according to a first configuration, the first magnetic field 100 is located on the left side of the discharge site, while the second magnetic field 102 is located on the right side of the discharge site.

Figure 6A:
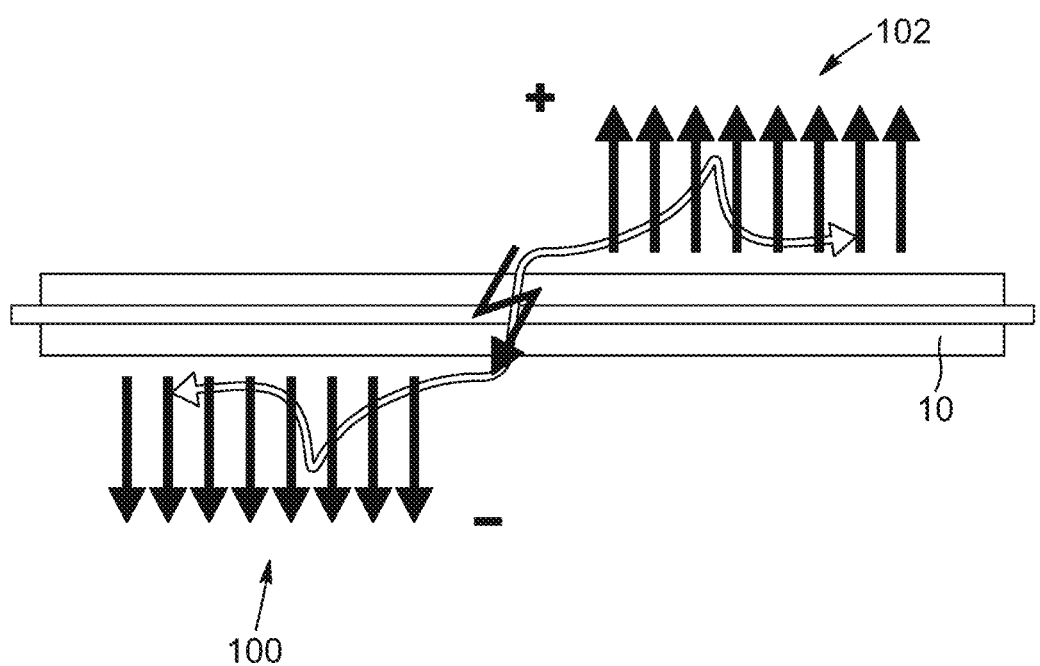
FIG. 6A is a diagram illustrating the orientation of the first and second magnetic fields on either side of a site of a partial discharge in an electrical equipment or accessory.

The two magnetic fields 100, 102 can be said to be of "opposite polarity". This feature is illustrated in the diagram provided in FIG. 6A. Specifically, the orientation of the first magnetic field is reversed (i.e., opposite) with respect to the orientation of the second magnetic field. That is, the first and second magnetic fields are inverted on either side of the partial discharge. This difference in the orientation of the first and second magnetic fields 100, 102 is due to the opposite direction of the current on either side of the partial discharge.

Generally described, and with reference to FIGS. 1 and 2, the apparatus 20 includes a first sensor 22, a second sensor 24, an acquisition module 26, a processor 28, and an alarm module 30.

The first sensor 22 and the second sensor 24 each have an operating range of 0 to 30 Megahertz. In some embodiments, the operating range is between 5 and 30 Megahertz, preferably between 14 and 20 Megahertz and even more preferably centered around 18 Megahertz. In this description, the term "operating range" is used to denote the bandwidth of the sensors, which is the frequency interval in which the signal attenuation is less than a specified or standard value. In some embodiments, both sensors 22, 24 are magnetic field sensors, such as current antennas. Alternatively, the sensors 22, 24 may be based on semiconductor or may be ferrite-based or any other material having characteristics compatible with the frequency range introduced above.

The first sensor 22 is configured to detect the first magnetic field 100 and produce a first signal representative of the first magnetic field, and the second sensor 24 is configured to detect the second magnetic field 102 and produce a second signal representative of the second magnetic field. Thus, in use, each of the two sensors 22, 24 detects a respective magnetic field (i.e., one of the two magnetic fields) and produces a corresponding signal representative of the detected magnetic field. In use, the first and second sensors 22, 24 can detect the direction of current along a cable, a junction, at the entrance or exit of any element of an electrical network.

The acquisition module 26 is operatively connected to the first sensor 22 and the second sensor 24. In this description, the terms "operatively connected," "connected," "coupled," and variations and derivatives thereof, refer to any connection or coupling, direct or indirect, between two or more elements. The connection or coupling between these elements may be mechanical, physical, optical, operational, electrical, wireless, or a combination thereof. The acquisition module 26 is configured to receive and record the two signals (i.e., the first signal and the second signal). In use, after acquisition, the two signals are processed to distinguish whether the partial discharge is located between the two sensors 22, 24 (e.g., in the center of the two sensors 22, 24) or not. In the example shown in FIG. 1, an amplification circuit 36 is disposed between the sensors 22, 24 and the acquisition module 26. This circuit will be described in more detail below.

Figure 3:
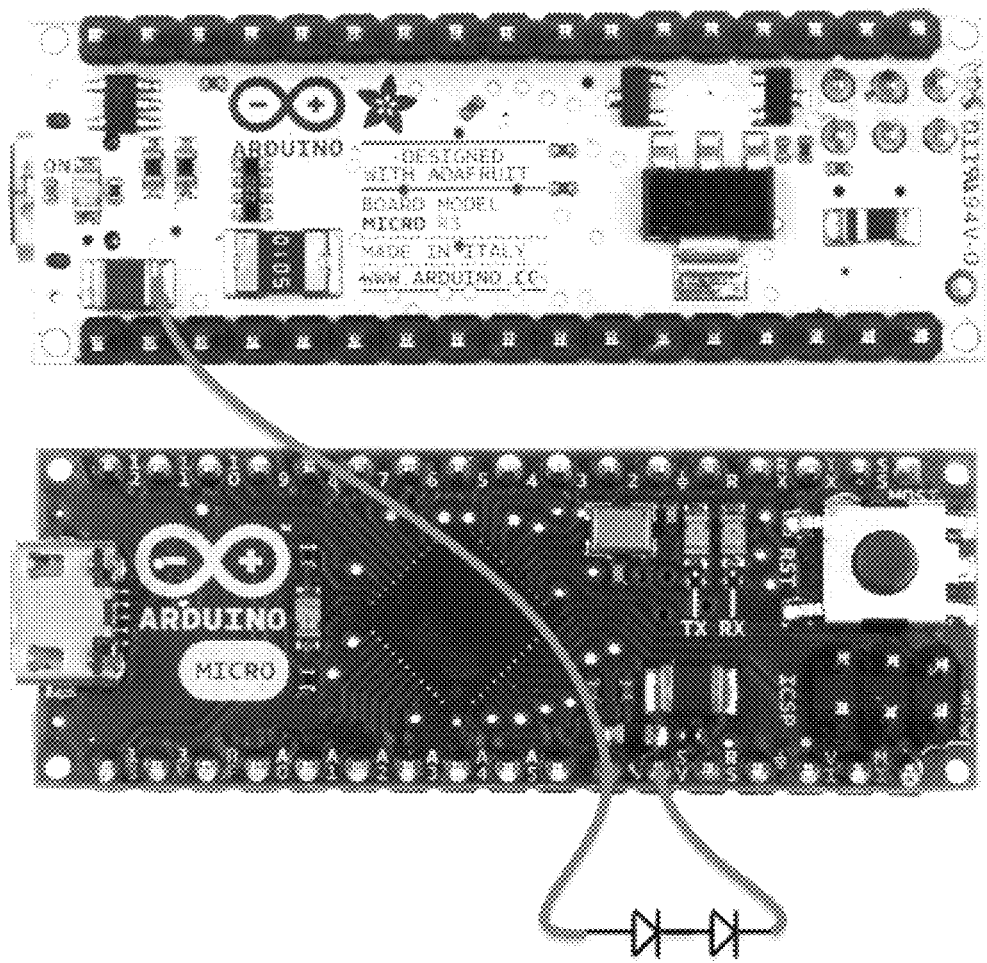
FIG. 3 illustrates a board included in an acquisition module, according to an embodiment.

In some embodiments, the acquisition module 26 is configured to convert the first and second signals from the analog domain to the digital domain to produce a first digital signal and a second digital signal. In some nonlimiting examples, the acquisition module 26 includes an electronic board 27, for example of the Arduino type, such as that shown in FIG. 3. This type of electronic board includes a microcontroller.

Figure 6B:
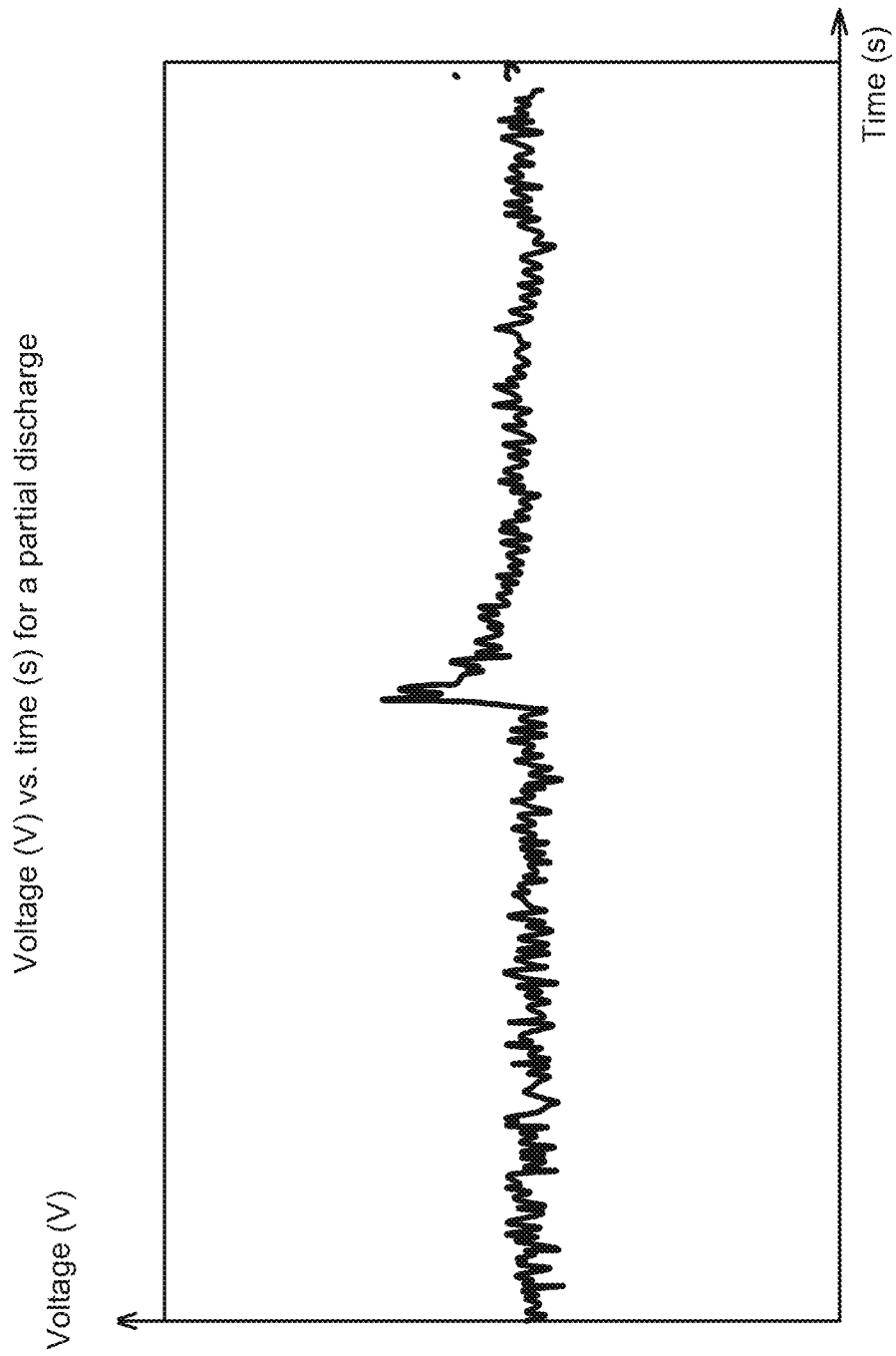
FIG. 6B is a graph illustrating a measurement of voltage versus time of a partial discharge.
Figure 7:
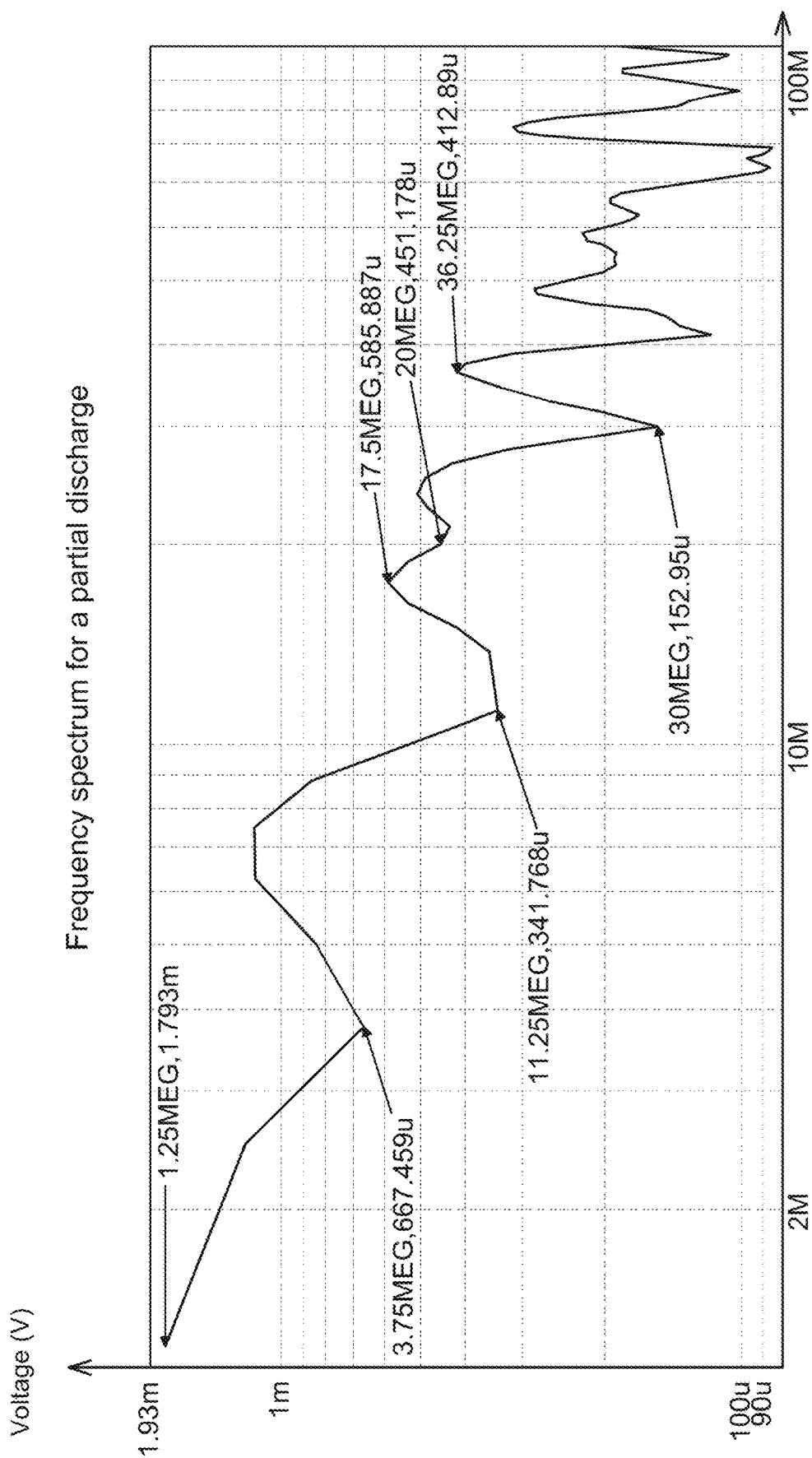
FIG. 7 is an illustration of a frequency spectrum of a partial discharge.
Figure 8:
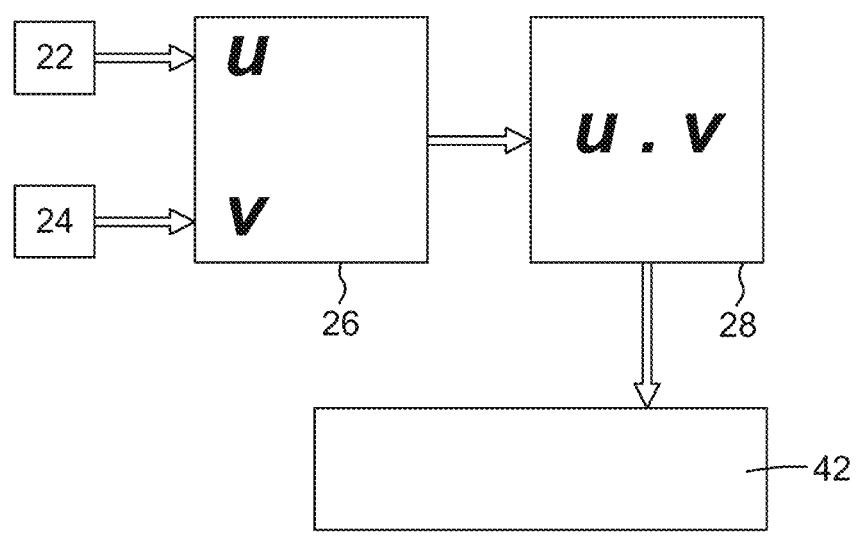
FIG. 8 is a general diagram illustrating an apparatus for detecting a partial discharge.

Following acquisition, the first and second signals can be displayed on a screen, as will be described later. A graph of the voltage, measured with a capacitive sensor, as a function of time, for a given partial discharge, is shown in FIG. 6B. Specifically, this measurement, illustrating a change in voltage as a function of time, was made with a capacitive sensor and measured on an oscilloscope. The transfer function of this type of measurement is substantially flat over a relatively wide band. Since the current has the same waveform as the voltage in the case of a transmission line, the frequency spectrum of the current can be obtained from the voltage spectrum. An example of a frequency spectrum is shown in FIG. 7. Analysis of the frequency spectrum shows a frequency range of 1 to 100 Mhz. In the graph of FIG. 7, it is illustrated that relatively low frequencies can be used in partial discharge detection, as indicated by the presence of "peaks" at different frequencies (see, for example, peaks present at 3.75 MHz, 11.25 MHz, 17.5 MHz, 20 MHz, and 30 MHz). It is understood that the expression "relatively low frequencies" includes, in particular, the frequency window previously described, i.e., a frequency ranging from 0 to 30 Megahertz. The selection of a relatively low frequency allows for relatively accurate measurements, while being compatible with a relatively low sampling rate, such as, for example and without limitation, about 180 or 200 Mega samples per second. More particularly, FIG. 7 also illustrates that it is possible to characterize a partial discharge based on a low frequency harmonic of the partial discharge. In other words, the apparatus 20 allows for the detection, location and characterization of a partial discharge using sensors 22, 24 centered at a relatively low frequency. These sensors 22, 24 allow for compatibility with less expensive electronic components and assemblies and also for miniaturization of the apparatus 20. In particular, the reduction in size of the apparatus 20 results in greater portability of the apparatus 20, as opposed to known systems that sometimes require substantially bulky equipment that is difficult to miniaturize. Indeed, some devices must, for example, be connected to processing systems that require to be moved by an industrial vehicle (e.g., a truck).

Still referring to FIG. 1, in some embodiments, the acquisition module 26 includes a first circular data buffer 32 and a second circular data buffer 34, the first circular data buffer 32 being configured to continuously acquire the first digital signal; and the second circular data buffer 34 being configured to continuously acquire the second digital signal.

The acquisition module 26 has certain functionality allowing it to be at least partially autonomous. For example, the acquisition module 26 may include a microcontroller that manages certain operations and may identify a situation in which either or both of the first and second circular data buffer 32, 34 would be full.

The apparatus 20 may further include an amplifier circuit 36 operatively connected to the first sensor 22, the second sensor 24 and the acquisition module 26. In some embodiments, the amplification circuit 36 is located upstream of the acquisition module 26 and includes two channels 37A, 37B, each operatively connected to a corresponding sensor 22, 24. In some examples, the first channel 37A is configured to receive and amplify the first signal and the second channel 37B is configured to receive and amplify the second signal. In these examples, each of the first channel 37A and second channel 37B includes an amplifier. The amplifiers are configured to amplify the first and second signals from the first and second sensors 22, 24. In some non-limiting examples, the gain of the amplifiers is controlled by the processor 28, for example as part of a microcomputer, and the gain is programmable from 20 V/V to 640 V/V in 5 scale stages.

With reference to FIG. 1, the acquisition module 26 includes one of the analog-to-digital converters associated with each of the channels 37A, B. In other embodiments, each of the channels 37A, 37B may each include an analog-to-digital converter. Each of the analog-to-digital converters has the function of digitizing the first and second signals (originating in analog format, i.e., a change in voltage) into digital signals. In particular, the digitization provides a digital voltage list that is sufficiently representative of the first and second signals associated with the partial discharge. The analog-to-digital converters can have, for example and without being limiting, a sampling frequency of 180 or 200 Mega samples per second.

In some embodiments, the apparatus 20 further includes a trigger circuit 38 operatively connected to the acquisition module 26. Optionally, the trigger circuit 38 could also be operatively connected to the processor 28. The trigger circuit 38 is configured to detect one of the first and second signals after amplification thereof, generate a trigger signal if a threshold value is reached and otherwise remain in a standby state, and send the trigger signal to the acquisition module 26. Optionally, the trigger signal could also be sent to the first and second circular data buffers 32, 34. In use, the trigger circuit 38 detects the voltage level from the amplifiers. The trigger circuit 38 may be adjusted via a command from the processor 28.

In some embodiments, the threshold value is a voltage value (in V). For example, and without being limitative, the voltage value may be between 1 mV and 100 mV. Alternatively, the threshold value may also be a current value (in A). In some embodiments, the threshold value is adjustable. For example, the user of the apparatus 20 could determine the threshold value at which the trigger signal should be sent. In another example, the threshold value could be automatically adjustable, i.e., the threshold value could be adjusted as a result of a measurement by both sensors 22, 24, for example, through a feedback loop. Such a feedback loop could, for example and without being limiting, monitor in real time a voltage or current level detected by the two sensors 22, 24, and be configured to adjust the threshold value accordingly.

In use, upon reception of the trigger signal, the first circular data buffer 32 stores first data representative of the first digital signal and sends the first data to the processor 28 for processing and the second circular data buffer 34 stores second data representative of the second digital signal and sends the second data to the processor 28 for processing. The recording of the first and second data may be done sequentially, quasi-simultaneously or simultaneously. In use, the acquisition module 26 may determine that the first circular data buffer 32 and the second circular data buffer 34 each contain pre-trigger data and post-trigger data prior to recording the first and second data. Alternatively, the processor 28 may send restart instructions to the acquisition module 26 to restart the recording of data in the first circular buffer 32 and the second circular buffer 34 after the data is recorded.

It should be noted that both the pre-trigger data and the post-trigger data can generally be useful to better characterize or more adequately identify partial discharges, for example by allowing for better monitoring of the resulting signal.

For example, the use of both pre-trigger and post-trigger data may allow the signal representative of a partial discharge to be more effectively distinguished from noise, for example by more accurately characterizing when the partial discharge pulse begins.

The processor 28 is operatively connected to the acquisition module 26, the processor 28 being configured to process the first and second signals to obtain a resulting signal, to issue alarm instructions if the resulting signal has a property representative of a partial discharge, and to remain in a sleep state otherwise. In some non-limiting examples, the processor 28 may be part of a Raspberry Pi type microcomputer or nano-computer.

In some embodiments, the processor 28 can perform one or more of the following functions, some of which will be described in more detail later in the description: communicating with the converter to receive signals in digital form, communicating with the trigger circuit 38 to impose a trigger level, controlling the gain of the amplifiers, controlling the power supply to the various components of the apparatus 20, displaying results, providing an interface, storing data, and performing processing on the harvested data so as to identify, locate, and characterize a partial discharge.

The resulting signal may generally be obtained by performing algorithmic processing of the first and second data. In some embodiments, the algorithmic processing comprises performing a product of the first data and the second data. In some non-limiting examples, the algorithmic processing is performed continuously and in real time.

The alarm module 30 is operatively connected to the processor 28. The alarm module 30 is configured to receive alarm instructions from the processor 28 and generate an alarm upon receipt thereof. In some embodiments, the alarm module 30 is configured to receive the alarm instructions from the processor 28 and produce the alarm in real time, when a partial discharge is detected. The alarm module 30 may include a visible alarm 46 and/or an audible alarm 46.

In some embodiments, and with reference to FIGS. 4, 5, and 5A-C, the apparatus 20 further includes a housing 40 for receiving and containing the acquisition module 26, the processor 28, and the alarm module 30. The housing 40 may also receive the trigger circuit 38 and the amplifier circuit 36. The housing 40 is preferably sized so that the apparatus 20 is portable. As illustrated in FIGS. 5 and 5A-C, the housing 40 may contain different sections (indicated by number 41, with each of the sections numbered 41', 41", and so forth). Alternatively, the housing 40 could be made of a single section (embodiment not shown). Also shown in these Figures is a conversion stage 39, positioned above the trigger circuit.

Figure 4:
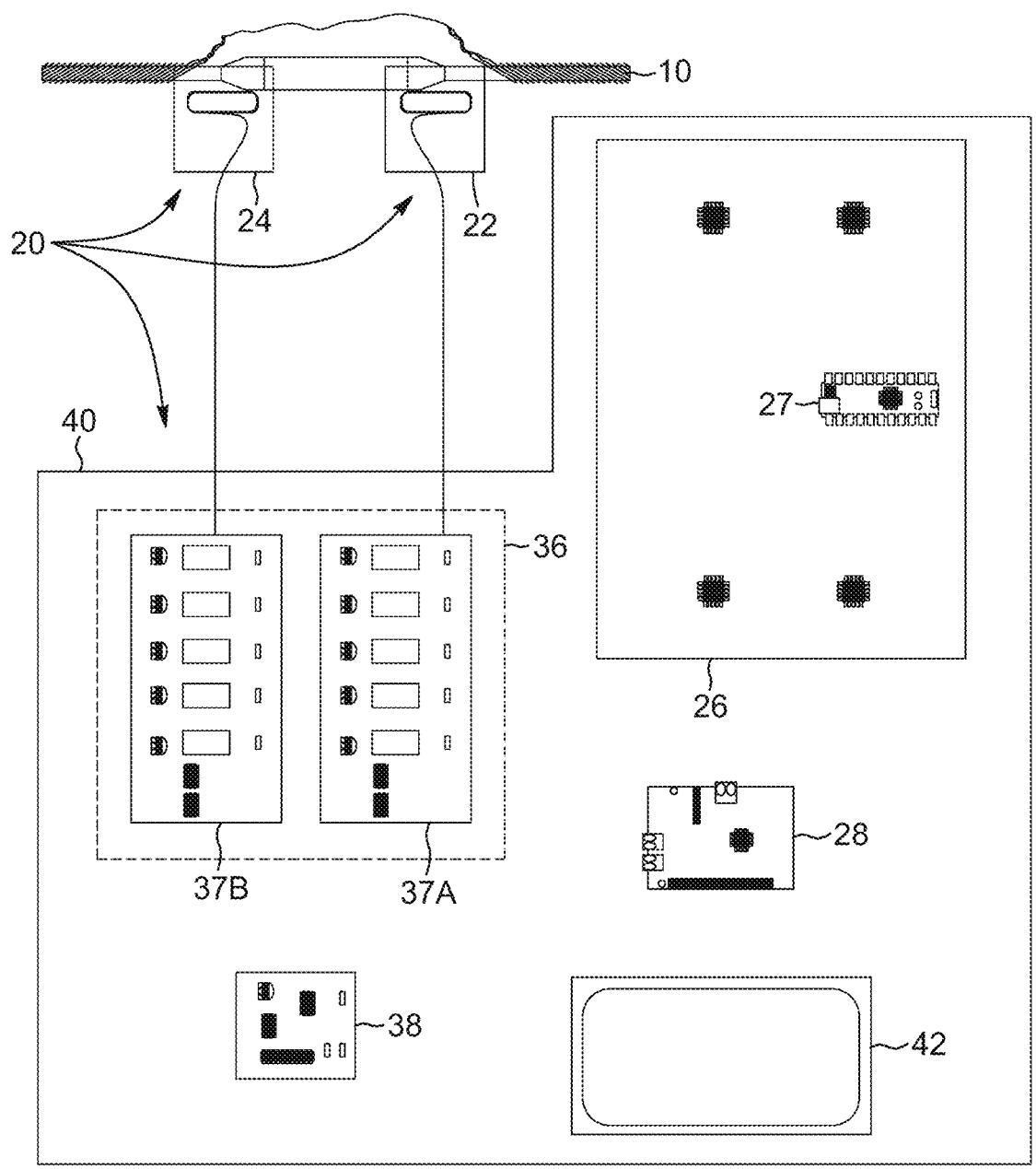
FIG. 4 illustrates a schematic diagram of various components of an apparatus for detecting a partial discharge, according to an embodiment.

In some non-limiting examples, such as that shown in FIGS. 5 and 5A-C the various components of the apparatus 20 (some of which are shown in FIG. 4) may be stacked on top of each other. In this example, the individual circuits are vertically stacked. This configuration of the various components allows for a more compact organization of the apparatus 20 and its elements.

In some examples, such as that illustrated in FIGS. 5 and 5A-C, the apparatus 20 further includes a power module 44, which may be mounted within the housing 40. In some embodiments, the power module 44 comprises one or more batteries and/or rechargeable batteries. In particular, these embodiments allow for greater or better portability of the apparatus 20. For example, the power module 44 may receive power from a set of batteries and thereby power all of the circuitry. Voltage levels of 5 V and 3.3 V can be provided. The power module 44 is configured to allow recharging of the batteries. The power module 44 may also allow, through control of the processor 28, powering or de-powering the various components of the apparatus 20. The power module 44 may include timers for turning off and on the processor 28.

The apparatus 20 may optionally include a display module 42. In FIG. 5, the display module 42 is stacked above the other stages of the apparatus 20 and thus on the surface of the housing 40, so as to be visible to a user. The display module 42 is generally configured to display the resulting signal in real time. In particular, the display module 42 may include a screen allowing, for example and without limitation, a user to view the signal or various characteristics thereof, thereby facilitating the location, identification, and characterization of a partial discharge. In the context of the present description, the term "display" (sometimes referred to as "monitor") refers to an output device for visual communication with the user. Thus, the monitor could be useful for informing the user of any information relevant to partial discharge detection.

In some embodiments, the display may be positioned on top of the various circuits contained in the apparatus 20. Thus, the display is superimposed on any of the components of the apparatus 20 so as to be visible to a user.

With reference to FIGS. 4A-G, a mode of operation of the apparatus 20 will now be described. In FIG. 4A, the device 10 under test (e.g., a cable) produces at least one partial discharge. As discussed earlier, these partial discharges produce two magnetic fields each having an opposite direction on either side thereof. In FIG. 4B, the two magnetic fields are detected by two sensors 22, 24 (e.g., current antennas) adapted to measure partial discharges operating, for example, at a frequency of 18 Megahertz. In FIG. 4C, two low noise amplifiers amplify the two signals from the sensors 22, 24. In FIG. 4D, a trigger circuit 38 will detect pulses from one of the amplifier channels 37A, B. The trigger circuit is configured to send a signal to the acquisition module 26 informing it that a signal has arrived on one of the channels 37A, B. In FIG. 4E, the acquisition module 26, and more particularly the memories 32, 34, keeps track of previously received signals continuously. Specifically, the signals are held in memory only after the signal produced by the trigger circuit 38 is received. In FIG. 4F, the processor 28 continuously interrogates the acquisition module 26, and sends instructions to the trigger circuit 38 (e.g., stop the continuous acquisition, save the received signals, and send the contents of the memories 32, 34 of the acquisition module 26 to the processor 28). In FIG. 4G, the results of the measurements and signal processing are displayed.

Advantageously, the above-described apparatus 20 can detect, locate and characterize a partial discharge using sensors 22, 24 centered at a relatively low frequency. In particular, these sensors 22, 24 are compatible with less expensive and relatively simpler and less energetically demanding electronic components and assemblies than those generally known in the prior art. In addition, the above-described apparatus 20 is portable, which may contribute to its ease of use, in addition to being able to provide a display of the characterization results.

Method for Detecting a Partial Discharge

A method for detecting a partial discharge occurring at a discharge site in an electrical equipment or accessory will now be described, an embodiment of which is illustrated in the schematic provided in FIG. 14. It is understood that the method 14 could be implemented, for example, using the non-limiting embodiments of the apparatus that have been previously presented.

Similar to what has been previously described, the partial discharge produces a current wave, which is associated with two magnetic fields (a first magnetic field located on a first side of the discharge site and a second magnetic field located on a second side of the discharge site, the two sides being located on opposite sides of the discharge site).

Figure 14:
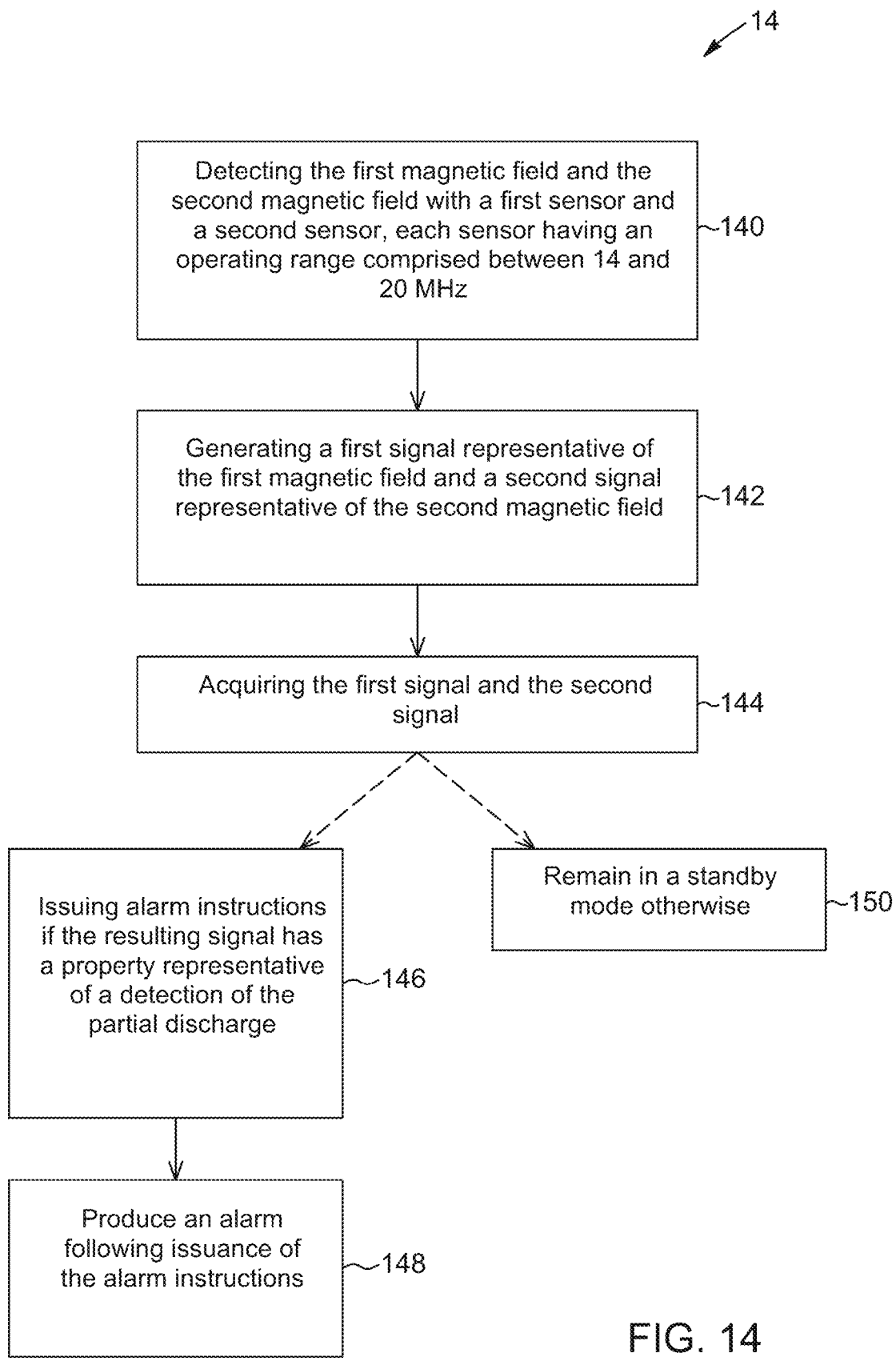
FIG. 14 is a diagram illustrating a method for detecting a partial discharge, according to one embodiment.

Broadly described, and with reference to FIG. 14, the method 14 includes a step 140 of detecting the first magnetic field and the second magnetic field with a first sensor and a second sensor. The two sensors are similar to those previously described. In some embodiments, the two sensors each have an operating range extending between about 0 Megahertz to about 30 Megahertz. In some embodiments, the operating range is between about 5 Megahertz and about 30 Megahertz, preferably between about 14 Megahertz and about 20 Megahertz and even more preferably centered around about 18 Megahertz. The method also includes a step 142 of generating a first signal representative of the first magnetic field and a second signal representative of the second magnetic field, followed by a step 144 of acquiring the first signal and the second signal. Following the acquisition of the first signal and the second signal, the method includes a step of producing a resulting signal by processing the first signal and the second signal with a processor. The processor, similar to those illustrated by previously described non-limiting embodiments, is configured to issue alarm instructions if the resulting signal has a property representative of a detection of partial discharge and remain in a standby mode otherwise. In cases where alarm instructions are issued, the method further comprises a step 148 of producing an alarm following issuance of the alarm instructions.

In some embodiments, the method is such that the operating range of the sensors is centered around about 18 Megahertz.

The method may also include a conversion step. For example, the method may include converting the first signal and the second signal from the analog domain to the digital domain and then producing a first digital signal and a second digital signal. In these examples, it is understood that the first signal and the second signal acquired in the acquisition step are analog signals before being converted to the digital domain using, for example and without being limitative, an analog-to-digital converter or any other electronic component(s) and/or arrangement for converting an analog signal into a digital signal.

In some embodiments, the method may include, after the conversion of the first signal and the second signal from the analog domain to the digital domain, an acquisition step. The acquisition step is generally achieved by operating the acquisition module described above. More particularly, in these embodiments, the method includes a step of acquiring the first digital signal with a first circular data buffer and a step of acquiring the second digital signal with a second circular data buffer. It should be noted that these steps may be done simultaneously, quasi-simultaneously, sequentially, or alternately. In some non-limiting examples, this step is performed at a sampling rate of approximately 200 mega samples per second. In one implementation, the sampling rate could be 180 mega samples per second.

In some embodiments, the first digital signal and the second digital signal are continuously acquired.

In some examples, the method may include an amplification step, i.e., a step of amplifying the first signal and the second signal. This step is typically performed prior to the conversion and acquisition of the first digital signal and the second digital signal, for example by using amplifiers or electronic component(s) to increase a property of the signal being amplified. For example, in some embodiments, the voltage, current or power of the first signal and/or the second signal may be amplified prior to the conversion and acquisition steps. This step is generally useful to allow the first signal and/or the second signal to be increased so that they are more readily usable, i.e., to facilitate the subsequent processing step.

In some examples, the method comprises detecting one of the first signal and the second signal after their amplification, generating a trigger signal if a threshold value is reached and remaining in a standby mode otherwise, and sending the trigger signal to the first circular data buffer and second circular data buffer. In these examples, upon receiving the trigger signal, the method also includes storing first data representative of the first digital signal with the first circular data buffer, storing second data representative of the second digital signal with the second circular data buffer, and sending the first data and the second data to the processor for processing. In some embodiments, the method includes a step of verifying that the first circular data buffer and the second circular data buffer contain pre-trigger data and post-trigger data prior to the data recording steps. The method may also include a step of sending restart instructions to the acquisition module to restart data recording in the first circular data buffer and the second circular data buffer after data recording.

In some embodiments, the threshold value is a voltage value (in V). In some non-limiting examples, the voltage value is between 1 mV and 100 mV. In other embodiments, the threshold value is a current value. It is understood that the threshold value, whether a voltage value or a current value, may be adjustable. In these embodiments, the method includes a step of adjusting the threshold value. This adjustment is typically accompanied by a step of predetermining the threshold value. The predetermination could be based, for example and without being limitative, on the level of ambient noise, the signal strength associated with the partial discharge or other factors influencing the detection, localization and characterization of a partial discharge.

The method also includes the step of performing algorithmic processing on the first data and the second data collected as a result of the acquisition. For example, in some embodiments, the algorithmic processing includes performing a product of the first data and the second data (i.e., multiplying the first data and the second data). In some implementations, the algorithmic processing is performed continuously and in real time. Alternatively, the algorithmic processing could be performed after a short delay or in near real time. The result of the algorithmic processing is representative of the presence or absence of a partial discharge.

Figure 9A:
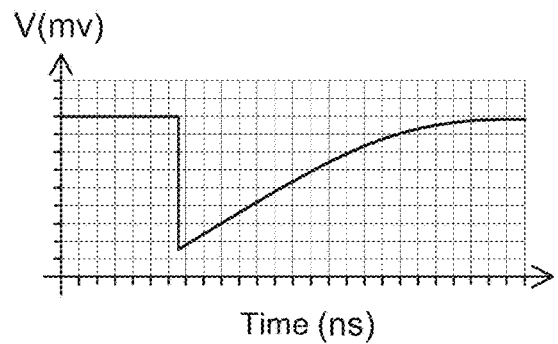
FIGS. 9A-E are representative graphs of a sequence for measuring and algorithmically processing a partial discharge, according to one embodiment.
Figure 9B:
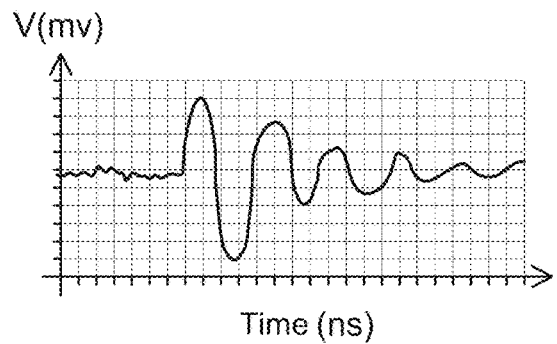
Figure 9C:
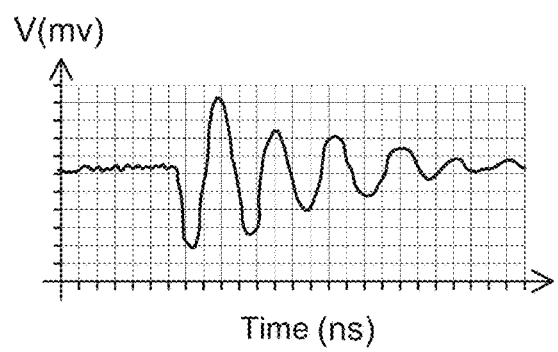
Figure 9D:
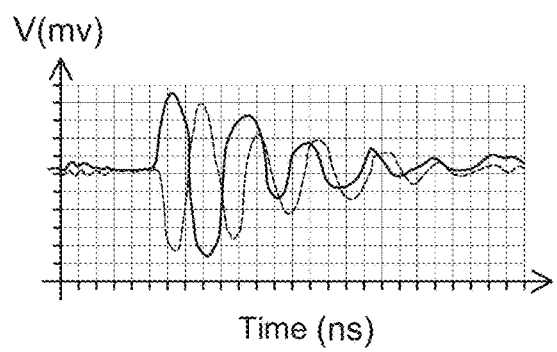

FIGS. 9A-E illustrate representative graphs of a sequence of measurement and algorithmic processing of a partial discharge, in accordance with one embodiment. The signal associated with the presence of a partial discharge is illustrated in FIG. 9A. During a measurement, two magnetic fields (not shown in FIGS. 9A-D) are detected, each producing a corresponding signal that is acquired after amplification. The acquired and amplified signals are shown in FIGS. 9B and 9C, each illustrating a signal collected by a corresponding channel (i.e., 37A and 37B). The processor receives both signals and performs the product of the signals. FIG. 9D illustrates the superposition of the acquired signals shown in FIGS. 9B and 9C. In the example shown, the processor multiplies the signal from one of the two channels (e.g., the one shown in FIG. 9B) with the signal from the other of the channels (e.g., the one shown in FIG. 9C. The result of the product described above is shown in FIG. 9E.

Figure 10:
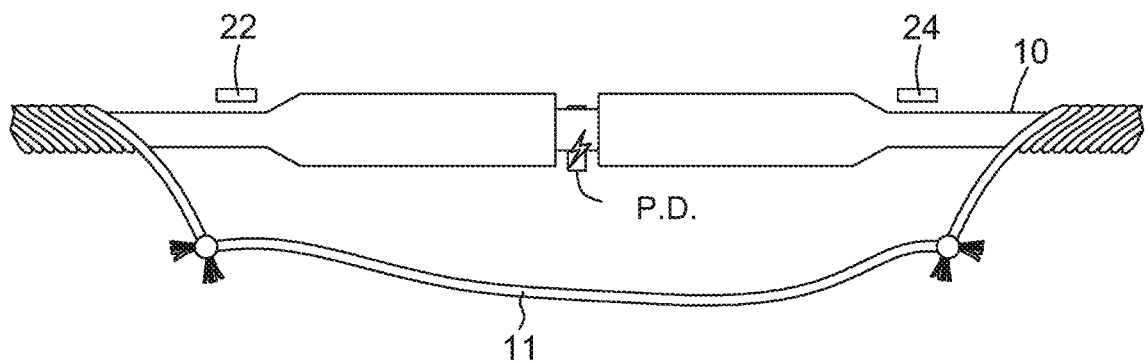
FIG. 10 illustrates a configuration for measuring a partial discharge by positioning two sensors on either side of the partial discharge.
Figure 11:
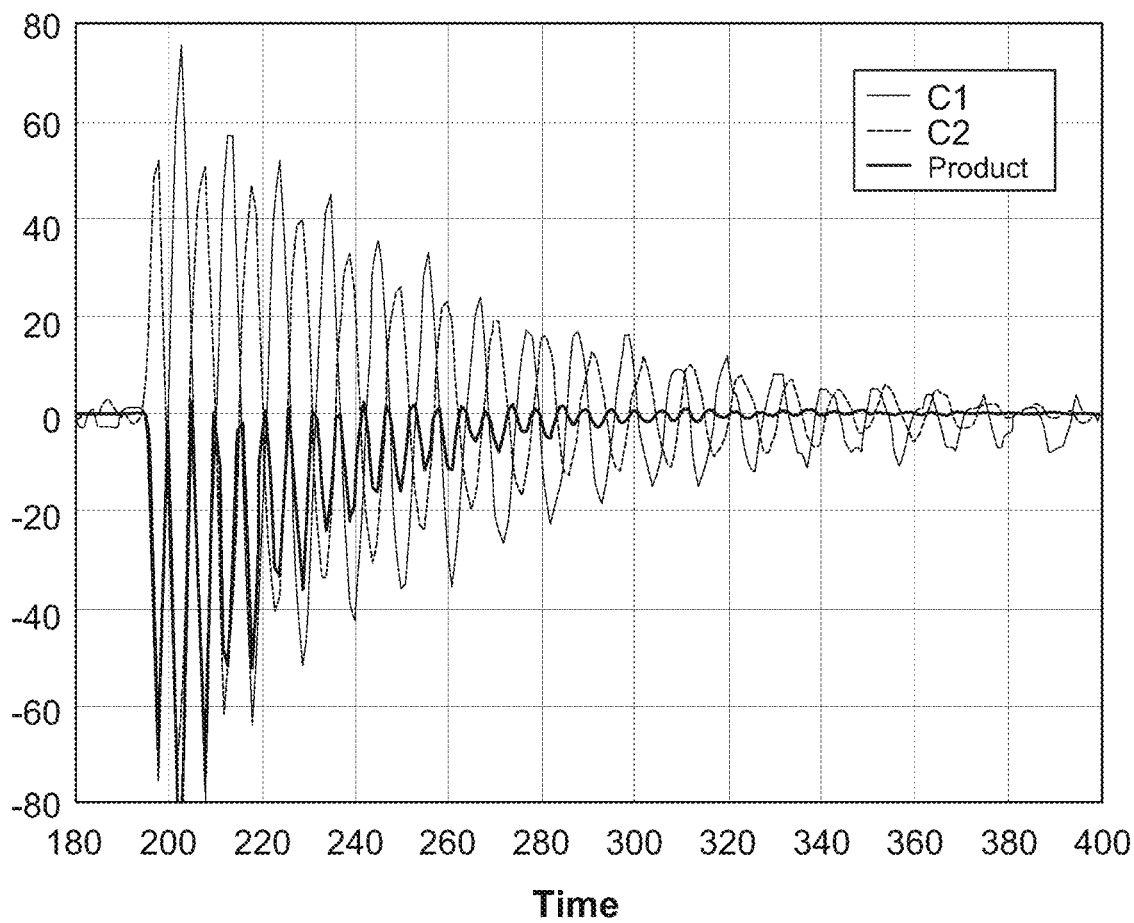
FIG. 11 is an example of a graph representative of a measurement that can be made using the configuration shown in FIG. 10. The graph illustrates the product of the two signals detected by the two sensors, when the partial discharge is between the two sensors.

FIGS. 10 and 11 illustrate an example of two sensors 22, 24 in use along a cable 10. In the illustrated example, the partial discharge (denoted as "P.D.") is located in the center of the cable 10, and the two sensors 22, 24 are positioned on opposite sides of the center of the cable 10. In FIG. 10, a ground wire 11 is connected to cable 10. In the example shown, the result of the product of the two signals will be negative. FIG. 11 illustrates the product ("product" of signals C1 collected by sensor 22 and C2 collected by sensor 24.

Figure 12:
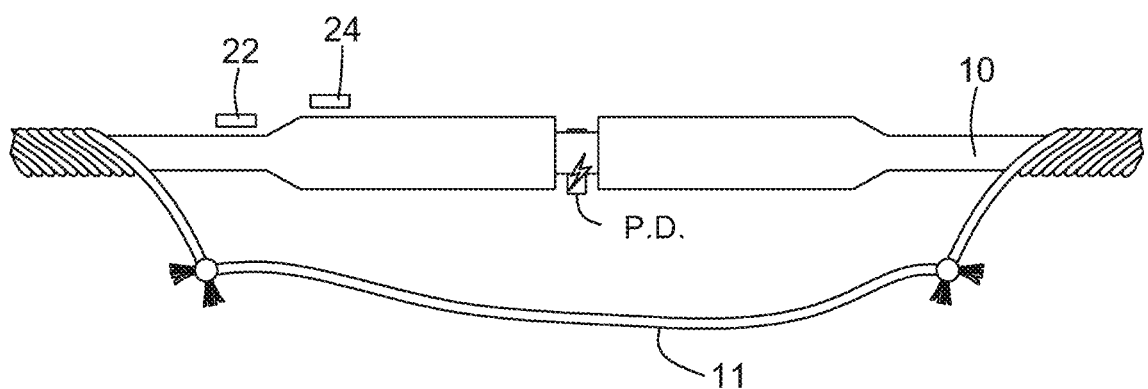
FIG. 12 illustrates a configuration for measuring a partial discharge by positioning two sensors on the same side of the partial discharge, according to one embodiment.
Figure 13:
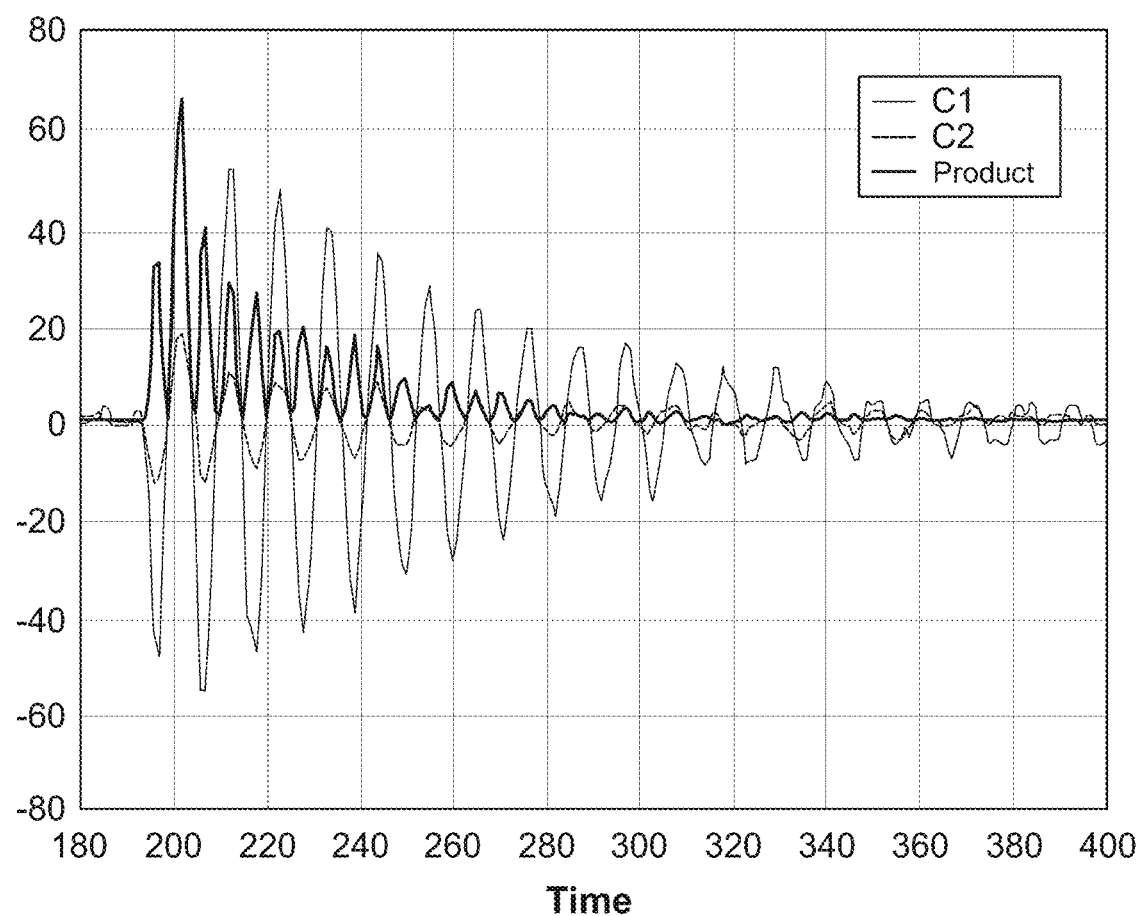
FIG. 13 is an example of a graph representative of a measurement that can be made using the configuration shown in FIG. 12. The graph illustrates the product of the two signals detected by the two sensors, when both sensors are on the same side of the partial discharge.

FIGS. 12 and 13 illustrate another example of two sensors 22, 24 in use along a cable 10. In FIG. 11, a ground wire 11 is connected to the cable 10. In the illustrated example, the partial discharge (denoted as "P.D.") is still located in the center of the cable 10, but the sensors 22, 24 are positioned near one end of the cable 10, so that the partial discharge is not located in the center of both sensors 22, 24. In the illustrated case, the signals collected by the first and second sensors 22, 24 are in phase, and the result of the product of the two signals will be positive. Note that although the signals are in phase, their amplitude could be different. FIG. 13 illustrates the product ("product" plot) of signals C1 collected by sensor 22 and C2 collected by sensor 24

In some embodiments, the steps of receiving alarm instructions from the processor and generating the alarm are performed in real time. Optionally, the method may allow the resulting signal to be displayed in real time. This step could be performed using a display, as previously described.

With reference to FIG. 14, the method also includes a step of emitting a visual alarm with a warning light if the resulting signal exhibits a property representative of partial discharge detection. The method may also include a step of emitting an audible alarm with a buzzer. It is noted that the visual or audible alarm could be used individually or together.

Figure 9E:
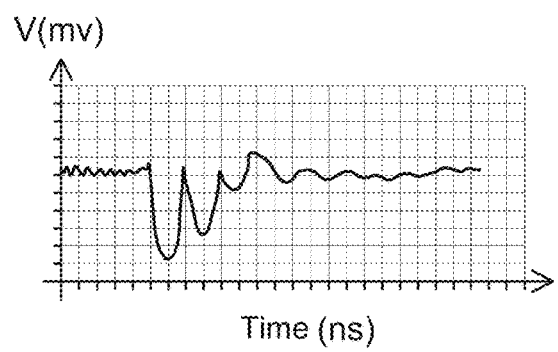

An example implementation of the method is shown in FIGS. 9A-E. In FIG. 9A, a partial discharge occurs in a network device. This produces a current wave with harmonics from 1 Megahertz to 1 Gigahertz. In FIGS. 9B-C, a pulse of 1 to 20 millivolts is detected as signals by sensors (e.g., current antennas), each with a relatively narrow bandwidth centered, for example and without limitation, around 18 Megahertz. The signals are then amplified so that they can be converted to digital values. In FIG. 9D, the signals are displayed so that they can be visually inspected to determine if they are a partial discharge. In FIG. 9E, the product of the signals is displayed to highlight the inversion of the signals and their proper timing. This step may, for example, facilitate automation of the detection. Appropriate algorithmic processing, such as that previously described, can detect, locate, interpret and characterize the partial discharge.

Although several preferred embodiments have been described in detail above and illustrated in the accompanying Figures, the invention is not limited to these embodiments. The person skilled in the art will understand that the claims are not to be limited in scope by the preferred embodiments illustrated in the examples presented above but are to be given the broadest interpretation consistent with the description as a whole.

The invention claimed is:

1. An apparatus for detecting a partial discharge occurring at a discharge site in an electrical equipment or accessory, the partial discharge producing a current wave, the current wave being associated with a first magnetic field located on a first side of the discharge site and a second magnetic field located on a second side of the discharge site, the second side being opposite the first side, the apparatus comprising:
    a first sensor and a second sensor, each sensor having an operating range equal to or below 30 Megahertz, the first sensor being configured to detect the first magnetic field and produce a first signal representative of the first magnetic field, and the second sensor configured to detect the second magnetic field and produce a second signal representative of the second magnetic field;
    an acquisition module operatively connected to the first sensor and the second sensor, the acquisition module being configured to receive and record the first signal and the second signal;
    a processor operatively connected to the acquisition module, the processor being configured to process the first signal and the second signal to obtain a resulting signal for:
        issuing alarm instructions if the resulting signal has a property representative of the partial discharge; and remaining in a standby mode otherwise; and
    an alarm module operatively connected to the processor, the alarm module being configured to receive the alarm instructions from the processor and produce an alarm upon reception thereof.

2. The apparatus of claim 1, wherein the operating range of the first sensor and the second sensor is between 5 and 30 Megahertz, between 14 and 20 Megahertz or centered around 18 Megahertz.

3. The apparatus of claim 1, wherein the acquisition module is configured to convert the first signal and the second signal from an analog domain to a digital domain, to produce a first digital signal and a second digital signal.

4. The apparatus of claim 3, wherein the acquisition module comprises a first circular data buffer and a second circular data buffer,
    the first circular data buffer being configured to continuously acquire the first digital signal; and
    the second circular data buffer being configured to continuously acquire the second digital signal.

5. The apparatus of claim 4, further comprising an amplification circuit operatively connected to the first sensor, the second sensor, and the acquisition module, wherein the amplification circuit is located upstream of the acquisition module and comprises two channels, each being operatively connected to a corresponding sensor,
    a first one of the two channels being configured to receive and amplify the first signal; and
    a second one of the two channels being configured to receive and amplify the second signal.

6. The apparatus of claim 5, wherein each of the two channels comprises an analog-to-digital converter having a sampling rate of 200 mega samples per second.

7. The apparatus of claim 5, further comprising a trigger circuit operatively connected to the acquisition module, the trigger circuit being configured to:
    detect one of the first signal and the second signal after amplification thereof;
    generate a trigger signal if a threshold value is reached and otherwise remain in the standby mode; and
    send the trigger signal to the acquisition module.

8. The apparatus of claim 7, wherein, upon receiving the trigger signal:
    the acquisition module determines that the first circular data buffer and the second circular data buffer each contain data;
    the first circular data buffer:
        stores first data representative of the first digital signal, the first data including pre-trigger data and post-trigger data; and
        sends the first data to the processor for processing;
    the second circular data buffer:
        stores second data representative of the second digital signal, the second data including pre-trigger data and post-trigger data; and
        sends the second data to the processor for processing; and the processor sends restart instructions to the acquisition module to restart storing the data in the first circular data buffer and the second circular data buffer.

9. The apparatus of claim 8, wherein the resulting signal is obtained by performing algorithmic processing of the first data and the second data.

10. The apparatus of claim 9, wherein the algorithmic processing is performed continuously and in real time.

11. The apparatus of claim 7, wherein the threshold value is a voltage value between 1 mV and 100 mV or a current value.

12. The apparatus of claim 1, wherein the apparatus is portable.

13. The apparatus of claim 1, wherein the alarm module is configured to receive the alarm instructions from the processor and produce the alarm in real time.

14. The apparatus of claim 1, wherein the alarm module comprises at least one of a visible alarm and an audible alarm.

15. A method for detecting a partial discharge occurring at a discharge site in an electrical equipment or accessory, the partial discharge producing a current wave, the current wave being associated with a first magnetic field located on a first side of the discharge site and a second magnetic field located on a second side of the discharge site, the second side being opposite the first side, the method comprising:
    detecting the first magnetic field and the second magnetic field with a first sensor and a second sensor, each sensor having an operating range equal to or below 30 Megahertz;
    generating a first signal representative of the first magnetic field and a second signal representative of the second magnetic field;
    acquiring the first signal and the second signal;
    producing a resulting signal by processing the first signal and the second signal with a processor, the processor being configured to:
        issue alarm instructions if the resulting signal has a property representative of a detection of the partial discharge; and
        remain in a standby mode otherwise; and
    produce an alarm following issuance of the alarm instructions.

16. The method of claim 15, wherein the operating range is between 5 and 30 Megahertz, 14 and 20 Megahertz or centered around 18 Megahertz.

17. The method of claim 15, further comprising:
    converting the first signal and the second signal from an analog domain to a digital domain; and
    generating a first digital signal and a second digital signal.

18. The method of claim 17, comprising:
    acquiring the first digital signal with a first circular data buffer; and
    acquiring the second digital signal with a second circular data buffer.

19. The method of claim 17, further comprising amplifying the first signal and the second signal.

20. The method of claim 19, further comprising:
    detecting one of the first signal and the second signal after amplification thereof;
    generating a trigger signal if a threshold value is reached and remaining in the standby mode otherwise; and
    sending the trigger signal to the acquisition module.

21. The method of claim 20, further comprising, upon receiving the trigger signal:
    determining that the first circular data buffer and the second circular data buffer each contain pre-trigger data and post-trigger data;
    storing first data representative of the first digital signal with the first circular data buffer;
    storing second data representative of the second digital signal with the second circular data buffer; and
    sending the first data and the second data to the processor for processing; and
    sending restart instructions to the acquisition module to restart recording of the data in the first circular data buffer and the second circular data buffer.

22. The method of claim 21, further comprising performing algorithmic processing on the first data and the second data.

23. The method of claim 20, wherein the threshold value is a voltage value between 1 mV and 100 mV or a current value.

24. The method of claim 15, further comprising emitting at least one of a visual alarm and an audible alarm as the alarm.

* * * * *